United States Patent
Yang

(10) Patent No.: US 9,536,602 B2
(45) Date of Patent: Jan. 3, 2017

(54) METHOD FOR WRITING DATA INTO FLASH MEMORY AND RELATED CONTROL APPARATUS

(71) Applicant: Silicon Motion Inc., Hsinchu County (TW)

(72) Inventor: Tsung-Chieh Yang, Hsinchu (TW)

(73) Assignee: Silicon Motion Inc., Hsinchu County (TW)

(*) Notice: Subject to any disclaimer, the term of this patent is extended or adjusted under 35 U.S.C. 154(b) by 0 days.

(21) Appl. No.: 14/689,058

(22) Filed: Apr. 17, 2015

(65) Prior Publication Data

US 2016/0148677 A1 May 26, 2016

(30) Foreign Application Priority Data

Nov. 21, 2014 (TW) .............................. 103140545 A

(51) Int. Cl.
G11C 16/26 (2006.01)
G11C 11/56 (2006.01)
G11C 16/32 (2006.01)

(52) U.S. Cl.
CPC ........... *G11C 11/5628* (2013.01); *G11C 16/26* (2013.01); *G11C 16/32* (2013.01); *G11C 2211/5648* (2013.01)

(58) Field of Classification Search
CPC ................................. G11C 16/26; G11C 16/10
USPC ....................................... 365/189.05, 185.24
See application file for complete search history.

(56) References Cited

U.S. PATENT DOCUMENTS

| | | | |
|---|---|---|---|
| 7,911,842 B2 * | 3/2011 | Park ................... | H01L 29/7883 365/185.03 |
| 8,228,728 B1 | 7/2012 | Yang | |
| 8,792,274 B1 * | 7/2014 | Tang ........................ | G11C 11/56 365/185.03 |
| 8,811,074 B2 * | 8/2014 | Goss ....................... | G11C 16/26 365/185.02 |
| 9,036,413 B2 * | 5/2015 | Wu ........................ | G11C 16/349 365/185.03 |
| 9,082,491 B2 * | 7/2015 | Lin .......................... | G11C 16/10 |
| 9,098,391 B2 * | 8/2015 | Yoo .......................... | G06F 12/00 |
| 9,164,835 B2 * | 10/2015 | Lee .......................... | G06F 11/1068 |
| 2009/0027961 A1 | 1/2009 | Park | |
| 2010/0146192 A1 | 6/2010 | Weingarten | |
| 2011/0216587 A1 | 9/2011 | Lee | |
| 2012/0198135 A1 | 8/2012 | Chilappagari | |
| 2013/0028019 A1 | 1/2013 | Shibata | |
| 2014/0140129 A1 | 5/2014 | Miida | |

FOREIGN PATENT DOCUMENTS

KR    1020090011249 A    2/2009

* cited by examiner

*Primary Examiner* — Michael Tran
(74) *Attorney, Agent, or Firm* — Winston Hsu; Scott Margo

(57) ABSTRACT

A method for writing data into a flash memory, wherein the flash memory includes a plurality multi-level cells, and each of the plurality of multi-level cells is capable of storing a plurality of bits. The method includes: storing a first bit into each of the plurality of multi-level cells respectively; determining if each of the plurality of multi-level cells stores the first bit respectively; and when each of the plurality of multi-level cells stores the first bit respectively, storing a second bit into each of the plurality of multi-level cells respectively.

22 Claims, 6 Drawing Sheets

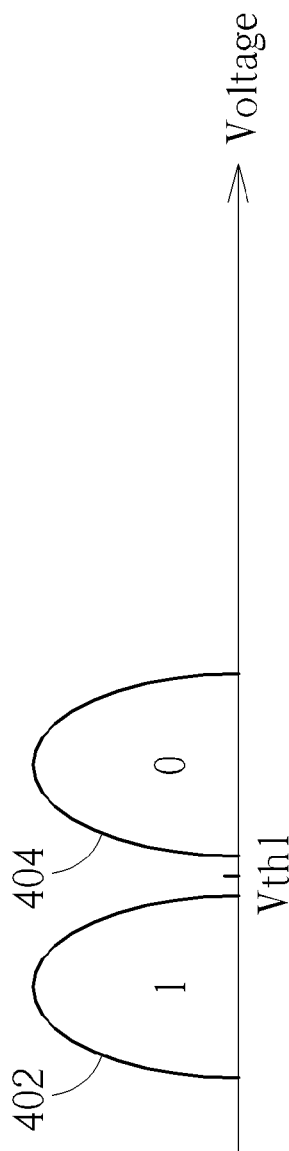

METHOD FOR WRITING DATA INTO FLASH MEMORY AND RELATED CONTROL APPARATUS

BACKGROUND OF THE INVENTION

1. Field of the Invention

The present invention relates to a method and control device for reading data in a flash memory, and more particularly, to a method and a control device for increasing the service life and operating speed of a flash memory.

2. Description of the Prior Art

In general, when a flash memory control circuit writes data into a memory unit in a flash memory, the flash memory control circuit will erase the data previously stored in the memory unit, and then begin to write the data into the memory unit. However, this slows the data writing speed of the flash memory, because the flash memory control circuit has to spend additional time on erasing the data previously stored in the memory unit. Further, in general, the service life of a flash memory is limited by the writing and erasing times of the flash memory. More writing times and erasing times of the flash memory result in a shorter service life of the flash memory. On the contrary, less writing times and erasing times of the flash memory result in a longer service life of the flash memory. Hence, how to increase the data writing speed and service life of the flash memory is an important issue.

SUMMARY OF THE INVENTION

Hence, a method and a control device proposed by the present invention focus on increasing the operating speed and service life of a flash memory.

A first embodiment of the present invention proposes a method for writing data into a flash memory. The flash memory includes a plurality of multi-level cells, and each of the plurality of multi-level cells is arranged to store a plurality of bits, the method includes: storing a first bit into each of the plurality of multi-level cells respectively; determining if each of the plurality of multi-level cells stores the first bit respectively; and when each of the plurality of multi-level cells stores the first bit respectively, storing a second bit into each of the plurality of multi-level cells respectively.

A second embodiment of the present invention proposes a control device, which is arranged to write data into a flash memory, and each of the plurality of multi-level cells is arranged to store a plurality of bits. The control device includes a writing circuit, and a determining circuit. The writing circuit is arranged to store a first bit into each of the plurality of multi-level cells respectively. The determining circuit is arranged to determine if each of the plurality of multi-level cells stores the first bit respectively. When the determining circuit determines that each of the plurality of multi-level cells stores the first bit respectively, the writing circuit stores a second bit into each of the plurality of multi-level cells respectively.

According to the embodiments of the present invention, the erasing times of the full-loaded data in the flash memory may be greatly reduced, and the erasing times of the data which is not fully loaded in the flash memory may be increased, thus increasing the writing speed and the service life of the flash memory.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram illustrating the electrical charge distribution of writing 1-bit data into 8192 multi-level units of a flash memory according to an embodiment of the present invention.

FIG. 5 is a diagram illustrating the electrical charge distribution of all 8192 multi-level units of a flash memory are written with 2-bit data according to an embodiment of the present invention.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
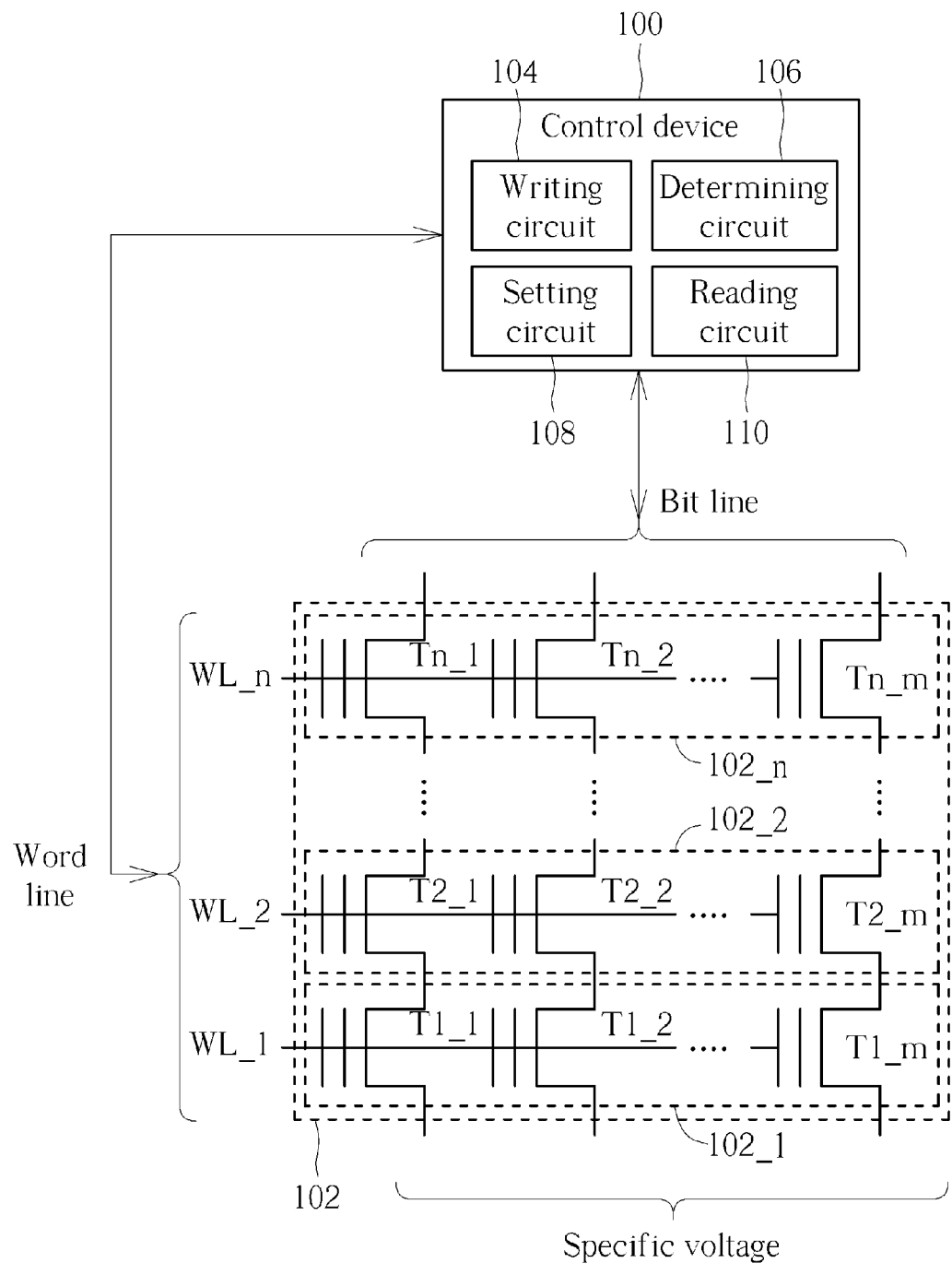
FIG. 1 is a diagram illustrating a control device according to an embodiment of the present invention.

Please refer to FIG. 1, which is a diagram illustrating a control device 100 according to an embodiment of the present invention. The control device 100 is a flash memory control circuit. Besides, a flash memory 102 is also shown in FIG. 1. The flash memory 102 includes a plurality of multi-level units, wherein each of the multi-level units may be arranged to store multi-bit data. For example, the flash memory 102 may be a flash memory block or flash memory page. In this embodiment, the flash memory 102 shown in FIG. 1 is illustrated as a flash memory block, and this flash memory block includes a plurality of flash memory pages 102_1-102_n, wherein the plurality of flash memory pages 102_1-102_n are controlled by a plurality of word lines WL_1-WL_n. More specifically, each of the plurality of flash memory pages 102_1-102_n includes a plurality of multi-level units. For example, the gates of the plurality of multi-level units T1_1-T1_m in the first flash memory page 102_1 are coupled to the first word line WL_1, and the gates of a plurality of multi-level units T2_1-T2_m in the second flash memory page 1022 are coupled to the second word line WL_2. Besides, the drains of the plurality of multi-level units Tn_1-Tn_m in the n-th flash memory pages 102_n are output ends of bit lines of the flash memory 102 in this embodiment, and the sources of the plurality of multi-level units T1_1-T1_m in the first flash memory pages 102_1 are coupled to a specific voltage, e.g., a ground voltage. Please note that, the flash memory 102 shown in this embodiment is merely a simplified flash memory block. In practice, the flash memory 102 may further include a control circuit for selectively controlling the outputs of bit lines and selectively coupling the aforementioned sources to ground. However, since the present invention does not focus on the design of the control circuit, the detailed descriptions thereof are omitted here for brevity.

Figure 2:
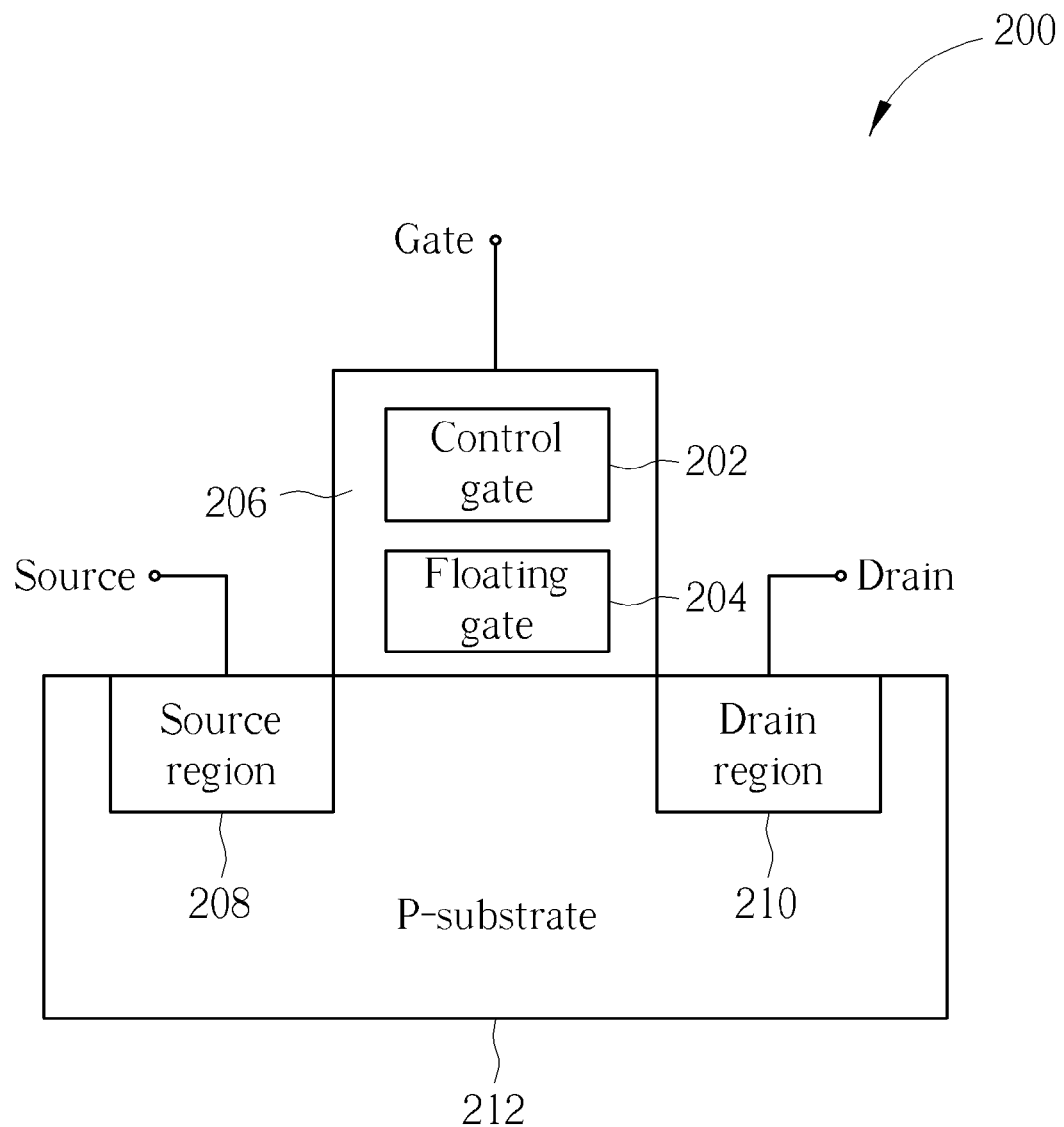
FIG. 2 is a diagram illustrating a multi-level unit according to an embodiment of the present invention.

Further, each of the plurality of multi-level units can be viewed as a metal oxide semiconductor field effect transistor (MOSFET), as shown in FIG. 2. FIG. 2 is a diagram illustrating a multi-level unit 200 according to an embodiment of the present invention. The multi-level unit 200 includes a control gate 202 and a floating gate 204, wherein the control gate 202 and the floating gate 204 are isolated by an oxide layer 206. For brevity, the multi-level unit 200 in this embodiment is implemented with an N type field effect transistor (FET). Hence, both a source region 208 and a drain region 210 of the MOSFET are N type regions, and a P-substrate 212 is configured between the source region 208 and the drain region 210.

Further, for better comprehension of the spirit of the present invention, the multi-level unit 200 in this embodiment is illustrated as a triple level cell (TLC). However, this is not meant to be a limitation to the present invention. Any modifications of the level numbers of multi-level cells fall within the scope of the present invention.

According to this embodiment of the present invention, the control device 100 includes a writing circuit 104, a determining circuit 106, a setting circuit 108 and a reading circuit 110. The writing circuit 104 is arranged to store a first bit into each of a plurality of multi-level units (e.g., T1_1-T1_m, ..., Tn_1-Tn_m) in the flash memory 102, respectively. The determining circuit 106 is arranged to determine whether each multi-level unit stores the first bit. If the determining circuit 106 determines that each of the multi-level units stores the first bit, the writing circuit 104 will store a second bit into each of the multi-level units, respectively. Then, the determining circuit 106 will further determine whether each of the multi-level units stores the second bit. If the determining circuit 106 determine that each of the multi-level units stores the second bit, the writing circuit 104 will store a third bit into each of the multi-level units, respectively. The setting circuit 108 is arranged to set at least one threshold voltage. The reading circuit 110 is arranged to read bit data stored in the plurality of multi-level units in the flash memory 102 according to the at least one threshold voltage.

Figure 3:
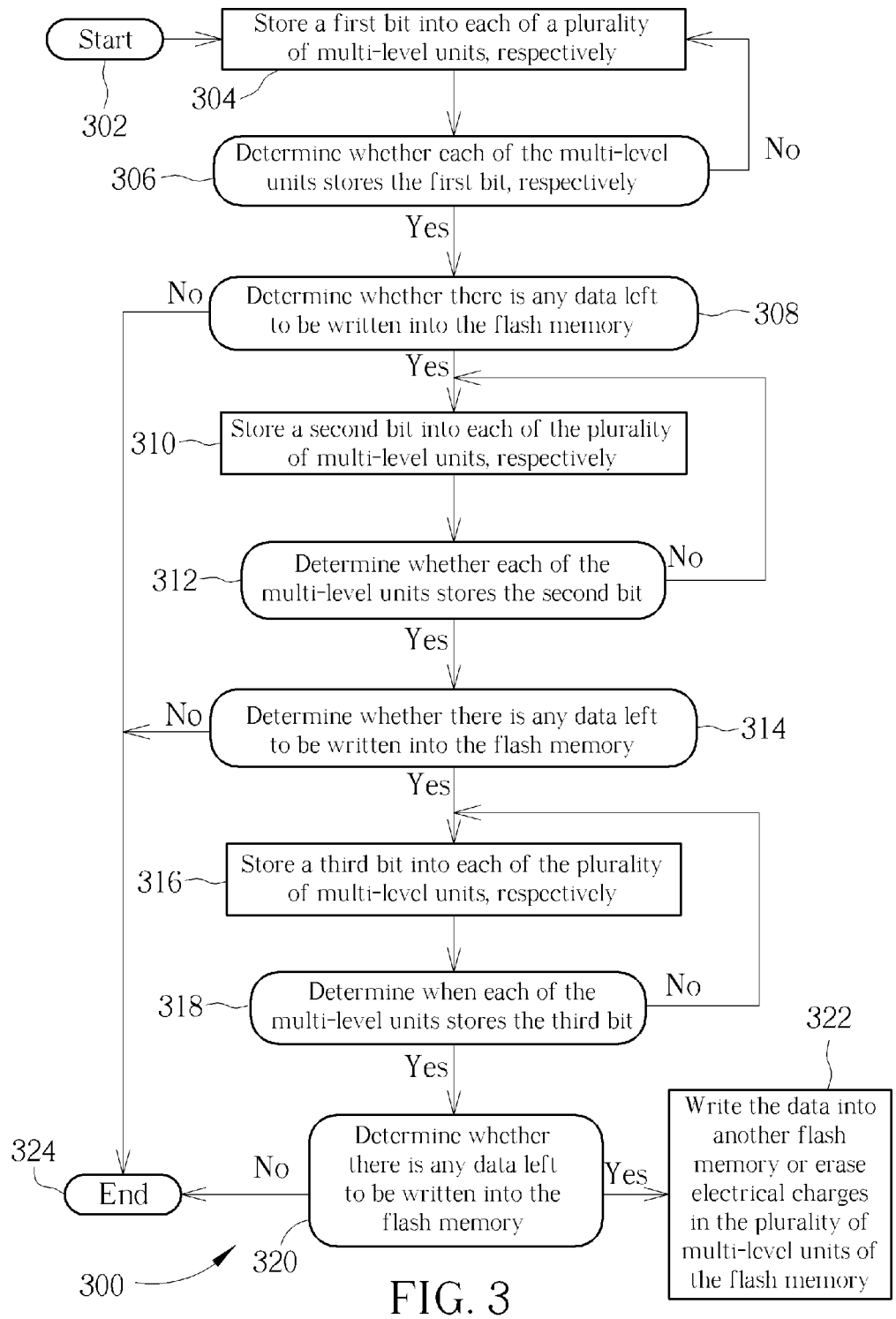
FIG. 3 is a flowchart illustrating a method for writing data into a flash memory according to an embodiment of the present invention.

More specifically, the operations of the control device 100 may be summarized as steps shown in FIG. 3. FIG. 3 is a flowchart illustrating a method 300 for writing data into the flash memory 102 according to an embodiment of the present invention. If the result is substantially the same, the steps are not required to be executed in the exact order shown in FIG. 3. Besides, the steps shown in FIG. 3 are not necessarily to be performed in sequence. That is, other steps can be inserted therein. Further, the following descriptions for the technical features of this embodiment assume that the plurality of multi-level units in the flash memory 102 do not store any data bit in the beginning. The method 300 is summarized as follows:

Step 302: Enable a data writing operation of the flash memory 102.

Step 304: Store a first bit into each of a plurality of multi-level units, respectively.

Step 306: Determine whether each of the multi-level units stores the first bit, respectively. If yes, go to Step 308; otherwise, go to Step 304.

Step 308: Determine whether there is any data left to be written into the flash memory 102. If yes, go to Step 310; otherwise, go to Step 324.

Step 310: Store a second bit into each of the plurality of multi-level units, respectively.

Step 312: Determine whether each of the multi-level units stores the second bit. If yes, go to Step 314; otherwise, go to Step 310.

Step 314: Determine whether there is any data left to be written into the flash memory 102. If yes, go to Step 316; otherwise, go to Step 324.

Step 316: Store a third bit into each of the plurality of multi-level units, respectively.

Step 318: Determine when each of the multi-level units stores the third bit. If yes, go to Step 320; otherwise, go to Step 316.

Step 320: Determine whether there is any data left to be written into the flash memory 102. If yes, go to Step 322; otherwise, go to Step 324.

Step 322: Write the data into another flash memory or erase electrical charges in the plurality of multi-level units of the flash memory 102, in order to continue to write data into the flash memory 102.

Step 324: End the data writing operation of the flash memory 102.

In the beginning, before the flash memory 102 is written with any data bit, the floating gates of the plurality of multi-level units of the flash memory 102 do not store any electrical charge. Then, when there is data to be written into the flash memory 102, the writing circuit 104 begins to store a first bit into each of the plurality of multi-level units, respectively (Step 304). For example, if there are total 8192 multi-level units in the flash memory 102, the writing circuit 104 will sequentially write 1-bit data into each of the multi-level units in Step 304, until all multi-level units are written or each multi-level unit stores 1-bit data. More specifically, for each of the multi-level units, the determining circuit 106 will first determine the data polarity of the first bit to be written into the multi-level unit, when the data polarity of the multi-level unit is a first polarity, the writing circuit 104 does not inject first electrical charge amount into the floating gate of the multi-level unit. Otherwise, when the data polarity of the multi-level unit is a second polarity, the writing circuit 104 will inject the first electrical charge amount into the floating gate of the multi-level unit. Please note that, in this embodiment, the first polarity is bit 1, and the second polarity is bit 0. However, it is not meant to be a limitation to the present invention. That is, configuring the first polarity to be bit 0 and configuring the second polarity to be bit 1 also belong to the scope of the present invention.

Please refer to FIG. 4, which is a diagram illustrating the electrical charge distribution of writing 1-bit data into 8192 multi-level units of a flash memory according to an embodiment of the present invention, wherein the curve 402 represents that there are total 4096 multi-level units storing bit 1, and the curve 404 represents there are total 4096 multi-level units storing bit 0. Please note that, the electrical charge distribution shown in FIG. 4 is merely an embodiment of the present invention, the present invention is not limited thereto. That is, in some embodiments of the present invention, the number of multi-level units storing bit 1 does not necessarily equal to the number of multi-level units arranged to storing bit 0.

Further, in this embodiment, since when the data polarity is bit 1, the writing circuit 104 does not inject the first electrical charge amount into the floating gate of the multi-level unit, the electrical charges stored in the floating gate of the multi-level unit written with bit 1 are less than the electrical charges stored in the floating gate of the multi-level unit written with bit 0. Consequently, in FIG. 4, the voltage corresponding to bit 1 is lower than the voltage corresponding to bit 0. Hence, when the reading circuit 110 reads data stored in a multi-level unit in the flash memory 102, it only requires coupling a word line of the multi-level unit to a threshold voltage Vth1 generated by the setting circuit 108. More specifically, when the threshold voltage Vth1 is coupled to the gate of the multi-level unit, if the multi-level unit outputs a current signal to a corresponding word line, the data stored by the multi-level unit is bit 1. Otherwise, when the threshold voltage Vth1 is coupled to the gate of the multi-level unit, if the multi-level unit does not output a current signal to a corresponding word line, the data stored in the multi-level unit is bit 0.

On the other hand, in Step 306, if the determining circuit 106 determines that there are still multi-level units in the flash memory 102 not written with 1-bit data, the writing circuit 104 will continue to write 1-bit data into these multi-level units, until all data is written or each multi-level unit stores 1-bit data. If the determining circuit 106 determines that after all multi-level unit in the flash memory 102 are written with 1-bit data, there is still some data required to be written into the flash memory 102 (Step 308), at this moment, the writing circuit 104 will sequentially store the second bit into each of the plurality of multi-level units, until all data is written or each of the multi-level units stores 2-bit data (Step 310).

In Step 308, if the determining circuit 106 determines that there is no data required to be written into the flash memory 102, the control device 100 will end the data writing operation of the flash memory 102 (Step 324).

In Step 310, the writing circuit 104 will continue to write a second bit to each of the multi-level units which has already stored 1-bit data, until all data is written or each multi-level unit stores 2-bit data. More specifically, for each of the multi-level units, the determining circuit 106 will first determine the data polarity of the first bit previously stored in the multi-level unit and then determine the data polarity of the second bit to be written into the multi-level unit. When the data polarity of the first bit of the multi-level unit is bit 1 and the data polarity of the second bit is also bit 1, the writing circuit 104 will not inject a second electrical charge amount into the floating gate of the multi-level unit. When the data polarity of the first bit of the multi-level unit is bit 1, and the data polarity of the second bit of the multi-level unit is bit 0, the writing circuit 104 will inject the second electrical charge amount into the floating gate of the multi-level unit. When the data polarity of the first bit of the multi-level unit is bit 0, and the data polarity of the second bit of the multi-level unit is bit 1, the writing circuit 104 will not inject a third electrical charge amount into the floating gate of the multi-level unit. When the data polarity of the first bit of the multi-level unit is bit 0, and the data polarity of the second bit of the multi-level unit is also bit 0, the writing circuit 104 will inject the third electrical charge amount into the floating gate of the multi-level unit, wherein the second electrical charge amount is different from the third electrical charge amount. In this embodiment, the second electrical charge amount is larger the third electrical charge amount, as shown in FIG. 5.

FIG. 5 is a diagram illustrating the electrical charge distribution of all 8192 multi-level units of a flash memory are written with 2-bit data according to an embodiment of the present invention, wherein the curve 502 represents that there are total 2048 multi-level units storing bit 11, the curve 504 represents that there are total 2048 multi-level units storing bit 01, the curve 506 represents that there are total 2048 multi-level units storing bit 00, and the curve 508 represents that there are total 2048 multi-level units storing bit 10. Please note that, the electrical charge distribution shown in FIG. 5 is merely an embodiment of the present invention, and not meant to be a limitation to the present invention. That is, in other embodiments of the present invention, the numbers of multi-level units arranged to store bits 11, 01, 00 and 10 respectively are not certainly identical. Besides, the numbers of multi-level units arranged to store bits 11, 01, 00 and 10 respectively may be adjusted. Hence, it can be seen from the above writing operation that, for a multi-level unit, the first bit written for the first time may be viewed as the most significant bit (MSB), and the second bit written for the second time may be viewed as the least significant bit (LSB).

Further, it can be seen from the above writing operation that, when the data polarity of the first bit of the multi-level unit is bit 1 and the data polarity of the second bit of the multi-level unit is also bit 1, the writing circuit 104 will not inject any electrical charge amount into the floating gate of the multi-level unit; when the data polarity of the first bit of the multi-level unit is bit 1 and the data polarity of the second bit of the multi-level unit is bit 0, the writing circuit 104 will only inject the second electrical charge amount into the floating gate of the multi-level unit; when the data polarity of the first bit of the multi-level unit is bit 0 and the data polarity of the second bit of the multi-level unit is bit 1, the writing circuit 104 will only inject the first electrical charge amount into the floating gate of the multi-level unit; and when the data polarity of the first bit of the multi-level unit is bit 0 and the data polarity of the second bit of the multi-level unit is also bit 0, the writing circuit 104 will inject both the first electrical charge amount and the third electrical charge amount into the floating gate of the multi-level unit. Hence, the electrical charges stored in to the floating gates of the multi-level units written with bits 11, 01, 00 and 10, respectively, will sequentially increase, as shown in FIG. 5. In this way, when the reading circuit 110 reads data stored in a multi-level unit of the flash memory 102, it only requires sequentially coupling word lines of the multi-level unit to three different threshold voltages (e.g., the threshold voltages Vth1, Vth2 and Vth3) to identify that the multi-level unit stores 2-bit data, wherein the threshold voltages Vth1, Vth2 and Vth3 are generated by the setting circuit 108. Please note that, the present invention does not limit a specific method of utilizing the reading circuit 110 to read 2-bit data stored in the multi-level units of the flash memory 102. Since one skilled in the art of this field is readily to know how to read 2-bit data stored in a multi-level unit according to threshold voltage Vth1, Vth2, Vth3, illustrations of the detailed operations of the reading circuit 110 are omitted here for brevity.

In Step 312, if the determining circuit 106 determines that there are still some multi-level units in the flash memory 102 not written with 2-bit data, the writing circuit 104 will continue to write 2-bit data into those multi-level units, until all data are written or each of the multi-level units stores 2-bit data. If the determining circuit 106 determines that after all the multi-level units in the flash memory 102 are all written with 2-bit data, there is still some data required to be written into the flash memory 102 (Step 314), the writing circuit 104 will sequentially store the third bit into each of the plurality of multi-level units, until all data is written or each of the multi-level units stores 3-bit data (Step 316).

In Step 314, if the determining circuit 106 determines that no data need to be written into the flash memory 102, the control device 100 will end the data writing operation of the flash memory 102 (Step 324).

In Step 316, the writing circuit 104 continues to write a third bit into each of the plurality of multi-level units storing 2-bit data, until all data is written or each of the multi-level units stores 3-bit data. More specifically, for each of the multi-level units, the determining circuit 106 will first determine the data polarities of the first bit and the second previously stored in the multi-level unit, and then determine the data polarity of the third bit to be written. When the data polarity of the first and second bits of the multi-level unit is bit 11, and the data polarity of the third bit of the multi-level unit is also bit 1, the writing circuit 104 does not inject a fourth electrical charge amount into the floating gate of the multi-level unit. When the data polarity of the first and second bits of the multi-level unit is bit 11, and the data polarity of the third bit of the multi-level unit is bit 0, the writing circuit 104 injects a fourth electrical charge amount into the floating gate of the multi-level unit. When the data polarity of the first and second bits of the multi-level unit is bit 01, and the data polarity of the third bit of the multi-level unit is bit 1, the writing circuit 104 does not inject a fifth electrical charge amount into the floating gate of the multi-level unit. When the data polarity of the first and second bits of the multi-level unit is bit 01, and the data polarity of the third bit of the multi-level unit is bit 0, the writing circuit 104 injects the fifth electrical charge amount into the floating gate of the multi-level unit. When the data polarity of the first and second bits of the multi-level unit is bit 00, and the data polarity of the third bit of the multi-level unit is also bit 1, the writing circuit 104 does not inject a sixth electrical charge amount into the floating gate of the multi-level unit. When the data polarity of the first and second bits of the multi-level unit is bit 00, and the data polarity of the third bit of the multi-level unit is also bit 0, the writing circuit 104 injects the sixth electrical charge amount into the floating gate of the multi-level unit. When the data polarity of the first and second bits of the multi-level unit is bit 10 and the data polarity of the third bit of the multi-level unit is bit 1, the writing circuit 104 does not inject a seventh electrical charge amount into the floating gate of the multi-level unit. When the data polarity of the first and second bits of the multi-level unit is bit 10, and the data polarity of the third bit of the multi-level unit is bit 0, the writing circuit 104 injects the seventh electrical charge amount into the floating gate of the multi-level unit, wherein the fourth electrical charge amount, the fifth electrical charge amount, the sixth electrical charge amount and the seventh electrical charge amount are different from one another. In this embodiment, the fourth electrical charge amount, the fifth electrical charge amount, the sixth electrical charge amount and the seventh electrical charge amount increase gradually, as shown in FIG. 6.

Figure 6:
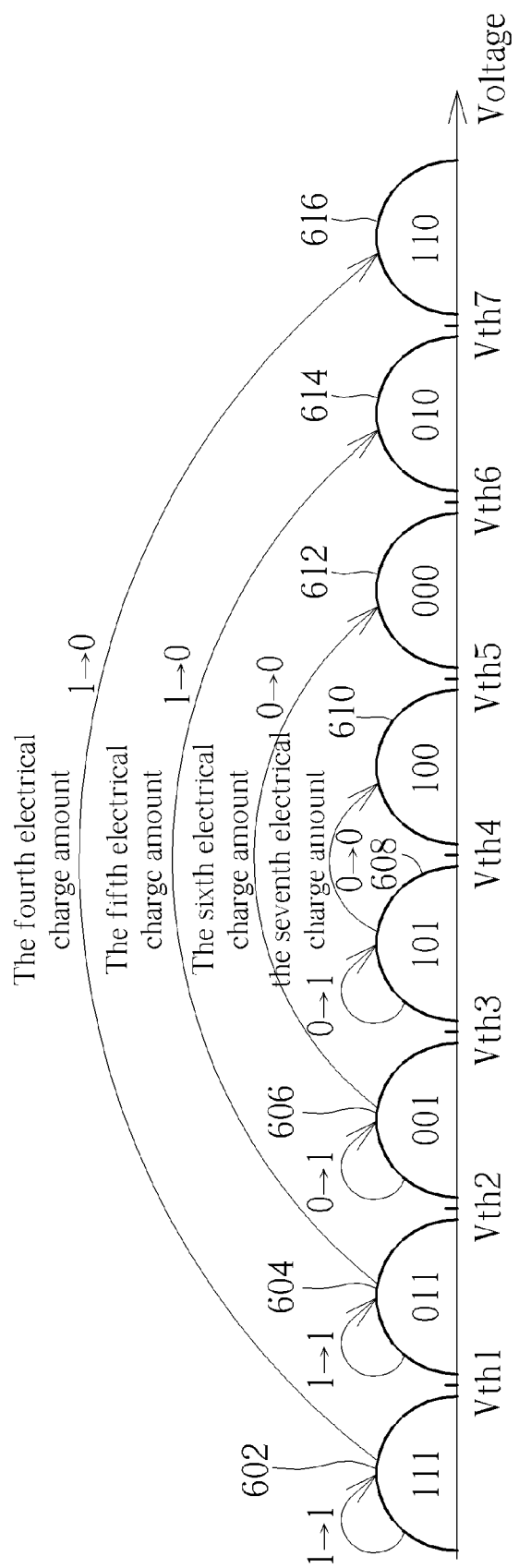
FIG. 6 is a diagram illustrating the electrical charge distribution of all 8192 multi-level units of a flash memory are written with 3-bit data according to an embodiment of the present invention.

FIG. 6 is a diagram illustrating the electrical charge distribution of all 8192 multi-level units of a flash memory are written with 3-bit data according to an embodiment of the present invention, wherein the curve 602 represents that there are total 1024 multi-level units storing bit 111, the curve 604 represents that there are total 1024 multi-level units storing bit 011, the curve 606 represents that there are total 1024 multi-level units storing bit 001, the curve 608 represents that there are total 1024 multi-level units storing bit 101, the curve 610 represents that there are total 1024 multi-level units storing bit 100, the curve 612 represents that there are total 1024 multi-level units storing bit 000, the curve 614 represents that there are total 1024 multi-level units storing bit 010, and the curve 616 represents that there are total 1024 multi-level units storing bit 110. Please note that, the electrical charge distributions shown in FIG. 6 are merely an embodiment of the present invention, and not meant to be a limitation to the present invention. That is, in other embodiments of the present invention, the numbers of multi-level units arranged to store bits 111, 011, 001, 101, 100, 000, 010 and 110 respectively are not certainly identical to one another. Besides, the numbers of multi-level units arranged to store bits 111, 011, 001, 101, 100, 000, 010 and 110 respectively may be adjusted. Hence, it can be seen from the above writing operation that, for a multi-level unit, the first bit written for the first time may be viewed as the most significant bit (MSB), the second bit written for the second time may be viewed as the secondary MSB, and the third bit written for the third time may be viewed as the least significant bit (LSB).

Further, it can be seen from the above writing operation that, when the data polarity of the first and second bits of the multi-level unit is bit 11 and the data polarity of the third bit of the multi-level unit is also bit 1, the writing circuit 104 will not inject any electrical charge amount into the floating gate of the multi-level unit; when the data polarity of the first and second bits of the multi-level unit is bit 11 and the data polarity of the third bit of the multi-level unit is bit 0, the writing circuit 104 will only inject the fourth electrical charge amount into the floating gate of the multi-level unit; when the data polarity of the first and second bits of the multi-level unit is bit 01 and the data polarity of the third bit of the multi-level unit is bit 1, the writing circuit 104 will only inject the first electrical charge amount into the floating gate of the multi-level unit; when the data polarity of the first and second bits of the multi-level unit is bit 01 and the data polarity of the third bit of the multi-level unit is bit 0, the writing circuit 104 will inject the first electrical charge amount and the sixth electrical charge amount into the floating gate of the multi-level unit; when the data polarity of the first and second bits of the multi-level unit is bit 00 and the data polarity of the third bit of the multi-level unit is bit 1, the writing circuit 104 will inject the first electrical charge amount and the third electrical charge amount into the floating gate of the multi-level unit; when the data polarity of the first and second bits of the multi-level unit is bit 00 and the data polarity of the third bit of the multi-level unit is bit 0, the writing circuit 104 will inject the first, third and seventh electrical charge amounts into the floating gate of the multi-level unit; when the data polarity of the first and second bits of the multi-level unit is bit 10 and the data polarity of the third bit of the multi-level unit is bit 1, the writing circuit 104 will only inject the second electrical charge amount into the floating gate of the multi-level unit; and when the data polarity of the first and second bits of the multi-level unit is bit 10 and the data polarity of the third bit of the multi-level unit is bit 0, the writing circuit 104 will inject the second electrical charge amount and the fifth electrical charge amount into the floating gate of the multi-level unit. Hence, the electrical charges stored in to the floating gates of the multi-level units written with bits 111, 011, 001, 101, 100, 000, 010 and 110 respectively will sequentially increase, as shown in FIG. 6. In this way, when the reading circuit 110 reads data stored in a multi-level unit of the flash memory 102, it only requires sequentially coupling word lines of the multi-level unit to six different threshold voltages (e.g., the threshold voltages Vth1, Vth2, Vth3, Vth4, Vth5 and Vth6) to identify the 3-bit data stored by in multi-level unit, wherein the threshold voltages Vth1, Vth1, Vth2, Vth3, Vth4, Vth5 and Vth6 are generated by the setting circuit 108. Please note that, the present invention does not limit a specific method of utilizing the reading circuit 110 to read 3-bit data stored in the multi-level units of the flash memory 102. Since one skilled in the art of this field is readily to know how to read 3-bit data stored in a multi-level unit according to threshold voltage Vth1, Vth2, Vth3, Vth4, Vth5 and Vth6, illustrations of the detailed operations of the reading circuit 110 are omitted here for brevity.

In Step 318, if the determining circuit 106 determines that there are still some multi-level units in the flash memory 102 not written with 3-bit data, the writing circuit 104 will continue to write 3-bit data into these multi-level units, until all data are written or each of the multi-level units stores 3-bit data. If the determining circuit 106 determines that after each of the multi-level units in the are all written with 3-bit data, there is still some data required to be written into the flash memory 102 (Step 320), the writing circuit 104 will write data into another flash memory or erase the electrical charges in the plurality of multi-level units of the flash memory 102, in order to continue to write data into the flash memory 102. Then, repeat the aforementioned Steps 302-322.

In Step 320, if the determining circuit 106 determines that there is no data need to be written into the flash memory 102, the control device 100 will end the data writing operation of the flash memory 102 (Step 324).

Figure 7:
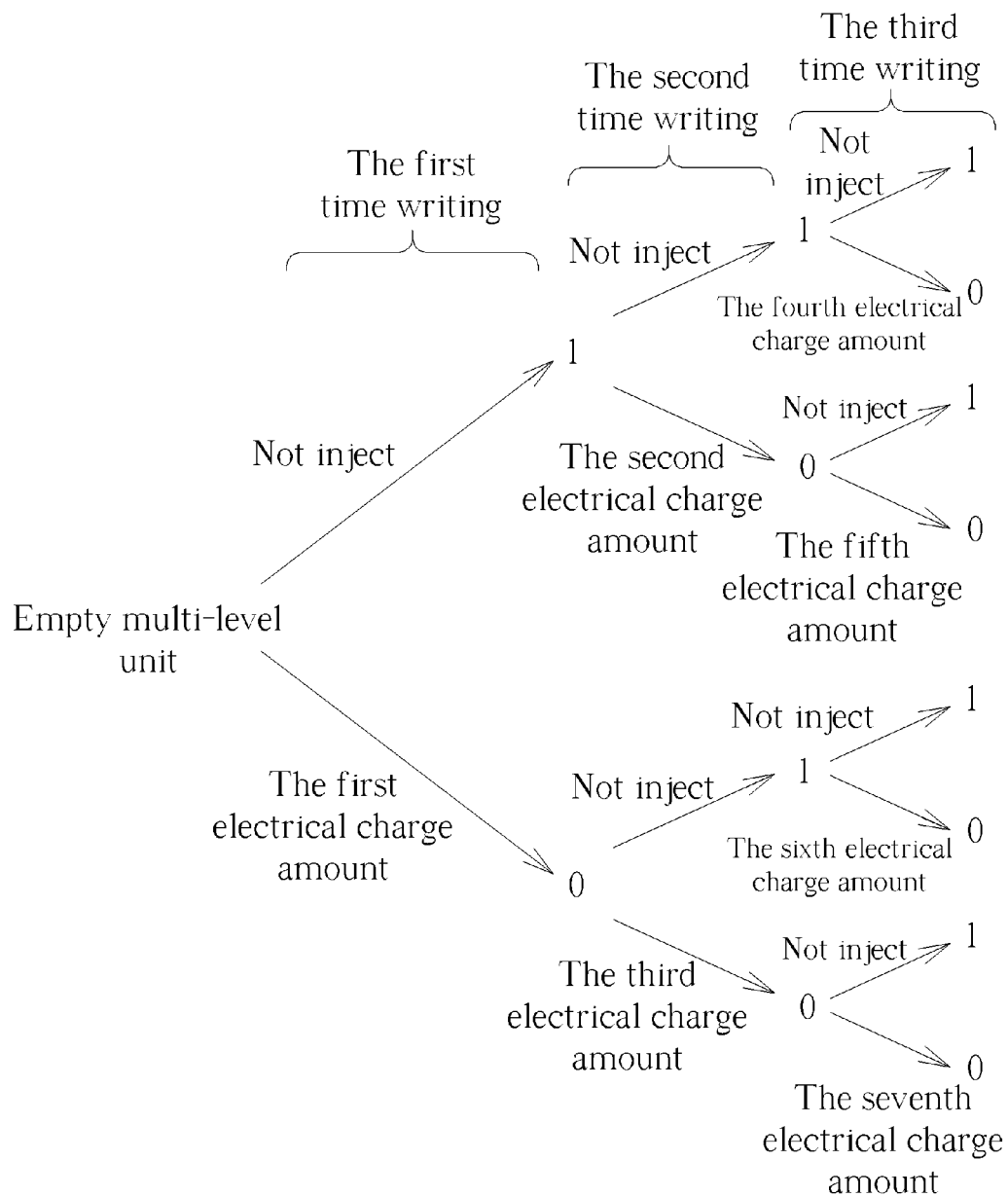
FIG. 7 is a diagram illustrating criteria of writing 3-bit data into each multi-level unit in a flash memory according to an embodiment of the present invention.

As can be seen from the method 300, when the writing circuit 104 writes bit 1 into a multi-level units, the writing circuit 104 will not inject electrical charges into the floating gate of the multi-level unit; and when the writing circuit 104 writes bit 0 into the multi-level unit, the writing circuit 104 will inject electrical charges into the floating gate of the multi-level unit, as shown in FIG. 7. FIG. 7 is a diagram illustrating the criteria of writing 3-bit data into each multi-level unit in the flash memory 102 according to an embodiment of the present invention. Hence, when writing the multi-level unit for the first time, if the data is bit 1, not injecting the electrical charges; and if the data is bit 0, injecting the first electrical charge amount. When writing the multi-level unit for the second time, if the data is bit 11 or 01, not injecting the electrical charges; if the data is bit 10, injecting the second electrical charge amount; if the data is bit 00, injecting the third electrical charge amount. when writing the multi-level unit for the third time, if the data is bit 111, 101, 011 or 001, not injecting electrical charges; if the data is bit 110, injecting the fourth electrical charge amount; if the data is bit 100, injecting the fifth electrical charge amount; if the data is bit 010, injecting the sixth electrical charge amount; if the data is bit 000, injecting the seventh electrical charge amount.

Please note that, although in the above example of embodiment, the triple level flash memory unit capable of storing 3-bit is illustrated. However, one skilled in the art of this filed is readily to realize that the above data writing method can be applied on flash memory units in any levels after reading the operation features of this embodiment. This also falls within the scope of the present invention.

According to the method 300 of the present invention, the control device 100 may include at least two different data writing operations. Firstly, if a plenty of data needs to be written into the flash memory 102, the control device 100 will begin to write 2-bit data after all of the multi-level units in the flash memory 102 are written with 1-bit data. Then, when all of the multi-level units in the flash memory 102 are written with 2-bit data, start to write the 3-bit data. Only when all of the multi-level units in the flash memory 102 are written with 3-bit data, the control device 100 will continue to store data into another flash memory. Secondly, if every time there is only a small amount of data need to be written, e.g., the small amount of data may only be written into each one or two bits of each multi-level unit of the flash memory 102. At this moment, the control device 100 may perform an erasing operation upon the flash memory 102 before each time new data is written into the flash memory 102, in order to erase one or two bits of each multi-level unit written in a previous time. After that, the control device 100 will write new data into the flash memory 102.

It can be known form the above two different types of data writing operations that, the first type data writing operation utilizes the control device 100 to perform the erasing operation upon the flash memory 102 at least until all of the multi-level units in the control device 102 are written with 3-bit data. Hence, the first type data writing operation may greatly reduce the erasing times of the 3-bit data (e.g., full-load data), thus increasing the writing speed and the service life of the flash memory 102. The second type of data writing operation is performed after data is written into one or two bits in each multi-level cell of the flash memory 102. Then, the control device 100 will perform an erasing operation upon the flash memory 102. Although the second type of data writing operation causes more data erasing times, the control device 100 only perform the erasing operation upon 1-bit or 2-bit data (e.g., the data which is not fully loaded) in the flash memory 102, rather than performing the erasing operation upon 3-bit data. Hence, the second type of data writing operation may also increasing the service life of the flash memory 102.

In view of the above, the control method for a flash memory control circuit proposes by the present invention first utilizes a lower bit in each multi-level unit in of a flash memory to write data, and the writes data into a higher bit of in each multi-level unit in of the flash memory until all of these lower bits are written with data. In this way, the present invention may greatly reduce the erasing times of the full-loaded data in the flash memory, and increase the erasing times of the data which is not fully loaded in the flash memory, thus increasing the writing speed and the service life of the flash memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for writing data into a flash memory, wherein the flash memory includes a plurality of multi-level cells, and each of the plurality of multi-level cells is arranged to store a plurality of bits, the method comprising:
storing a first bit into each of the plurality of multi-level cells respectively, and for each of the plurality of multi-level cells:
determining a data polarity of a first bit to be written into the multi-level cell;

when the data polarity of the first bit is a first polarity, not injecting a first electrical charge amount into a floating gate of the multi-level cell; and when the data polarity of the first bit is a second polarity, injecting the first electrical charge amount into the floating gate of the multi-level cell;

determining if each of the plurality of multi-level cells stores the first bit respectively; and when each of the plurality of multi-level cells stores the first bit respectively, storing a second bit into each of the plurality of multi-level cells respectively.

2. The method of claim 1, wherein for each of the plurality of multi-level cells, the first bit is a most significant bit stored in the multi-level cell, and the second bit is a least significant bit stored in the multi-level cell.

3. The method of claim 1, wherein for each of the plurality of multi-level cells, the first bit is a least significant bit stored in the multi-level cell, and the second bit is a most significant bit stored in the multi-level cell.

4. The method of claim 1, further comprising:
determining if each of the plurality of multi-level cells stores the second bit respectively; and
when each of the plurality of multi-level cells stores the second bit respectively, storing a third bit into each of the plurality of multi-level cells respectively.

5. The method of claim 4, wherein for each of the plurality of multi-level cells, the first bit is a most significant bit stored in the multi-level cell, the second bit is a second most significant bit stored in the multi-level cell, and the third bit is a least significant bit stored in the multi-level cell.

6. The method of claim 4, wherein for each of the plurality of multi-level cells, the first bit is a least significant bit stored in the multi-level cell, the second bit is a second most significant bit stored in the multi-level cell, and the third bit is a most significant bit stored in the multi-level cell.

7. The method of claim 4, wherein the step of storing the third bit into each of the plurality of multi-level cells respectively comprises:
for each of the plurality of multi-level cells:
determining a data polarity of the third bit to be written into the multi-level cell;
when the data polarity of the first bit is the first polarity, the data polarity of the second bit is the first polarity, and the data polarity of the third bit is the first polarity, not injecting a fourth electrical charge amount into the floating gate of the multi-level cell;
when the data polarity of the first bit is the first polarity, the data polarity of the second bit is the first polarity, and the data polarity of the third bit is the second polarity, injecting the fourth electrical charge amount into the floating gate of the multi-level cell;
when the data polarity of the first bit is the first polarity, the data polarity of the second bit is the second polarity, and the data polarity of the third bit is the first polarity, not injecting a fifth electrical charge amount into the floating gate of the multi-level cell;
when the data polarity of the first bit is the first polarity, the data polarity of the second bit is the second polarity, and the data polarity of the third bit is the second polarity, injecting the fifth electrical charge amount into the floating gate of the multi-level cell;
when the data polarity of the first bit is the second polarity, the data polarity of the second bit is the first polarity, and the data polarity of the third bit is the first polarity, not injecting a sixth electrical charge amount into the floating gate of the multi-level cell;
when the data polarity of the first bit is the second polarity, the data polarity of the second bit is the first polarity, and the data polarity of the third bit is the second polarity, injecting the sixth electrical charge amount into the floating gate of the multi-level cell;
when the data polarity of the first bit is the second polarity, the data polarity of the second bit is the second polarity, and the data polarity of the third bit is the first polarity, not injecting a seventh electrical charge amount into the floating gate of the multi-level cell; and
when the data polarity of the first bit is the second polarity, the data polarity of the second bit is the second polarity, and the data polarity of the third bit is the second polarity, injecting the seventh electrical charge amount into the floating gate of the multi-level cell.

8. The method of claim 7, wherein the fourth electrical charge amount, the fifth electrical charge amount, the sixth electrical charge amount and the seventh electrical charge amount are different from one another.

9. The method of claim 1, wherein the first polarity is bit 1, and the second polarity is bit 0; or the first polarity is bit 0, and the second polarity is bit 1.

10. The method of claim 1, wherein the step of storing the second bit into each of the plurality of multi-level cells respectively comprises:
for each of the plurality of multi-level cells:
determining a data polarity of the second bit to be written into the multi-level cell;
when the data polarity of the first bit is the first polarity and the data polarity of the second bit is the first polarity, not injecting a second electrical charge amount into the floating gate of the multi-level cell;
when the data polarity of the first bit is the first polarity and the data polarity of the second bit is the second polarity, injecting the second electrical charge amount into the floating gate of the multi-level cell;
when the data polarity of the first bit is the second polarity and the data polarity of the second bit is the first polarity, not injecting a third electrical charge amount into the floating gate of the multi-level cell; and
when the data polarity of the first bit is the second polarity and the data polarity of the second bit is the second polarity, injecting the third electrical charge amount into the floating gate of the multi-level cell.

11. The method of claim 10, wherein the second electrical charge amount is different from the third electrical charge amount.

12. A control device for writing data into a flash memory, wherein the flash memory includes a plurality of multi-level cells, and each of the plurality of multi-level cells is arranged to store a plurality of bits, the control device comprising:
a writing circuit, arranged to store a first bit into each of the plurality of multi-level cells respectively; and
a determining circuit, arranged to determine if each of the plurality of multi-level cells stores the first bit respectively;
wherein when the determining circuit determines that each of the plurality of multi-level cells stores the first bit respectively, the writing circuit stores a second bit into each of the plurality of multi-level cells respectively; and the writing circuit comprises:

a determining unit, arranged to determine a data polarity of the first bit to be written into the multi-level cell; and a writing unit, wherein when the data polarity of the first bit is a first polarity, the writing unit does not inject a first electrical charge amount into a floating gate of the multi-level cell; and when the data polarity of the first bit is a second polarity, the writing unit injects the first electrical charge amount into the floating gate of the multi-level cell.

13. The control device of claim 12, wherein for each of the plurality of multi-level cells, the first bit is a most significant bit stored in the multi-level cell, and the second bit is a least significant bit stored in the multi-level cell.

14. The control device of claim 12, wherein for each of the plurality of multi-level cells, the first bit is a least significant bit stored in the multi-level cell, and the second bit is a most significant bit stored in the multi-level cell.

15. The control device of claim 12, wherein the determining circuit is further arranged to determine if each of the plurality of multi-level cells stores the second bit respectively; when the determining circuit determines that each of the plurality of multi-level cells stores the second bit respectively, the writing circuit stores a third bit into each of the plurality of multi-level cells respectively.

16. The control device of claim 15, wherein for each of the plurality of multi-level cells, the first bit is a most significant bit stored in the multi-level cell, the second bit is a second most significant bit stored in the multi-level cell, and the third bit is a least significant bit stored in the multi-level cell.

17. The control device of claim 15, wherein for each of the plurality of multi-level cells, the first bit is a least significant bit stored in the multi-level cell, the second bit is a second most significant bit stored in the multi-level cell, and the third bit is a most significant bit stored in the multi-level cell.

18. The control device of claim 12, wherein the first polarity is bit 1, and the second polarity is bit 0; or the first polarity is bit 0, and the second polarity is bit 1.

19. The control device of claim 12, wherein the determining unit is further arranged to determining a data polarity of the second bit to be written into the multi-level cell; when the data polarity of the first bit is the first polarity and the data polarity of the second bit is the first polarity, the writing unit does not inject a second electrical charge amount into the floating gate of the multi-level cell; when the data polarity of the first bit is the first polarity and the data polarity of the second bit is the second polarity, the writing unit injects the second electrical charge amount into the floating gate of the multi-level cell; when the data polarity of the first bit is the second polarity and the data polarity of the second bit is the first polarity, the writing unit does not inject a third electrical charge amount into the floating gate of the multi-level cell; and when the data polarity of the first bit is the second polarity and the data polarity of the second bit is the second polarity, the writing unit injects the third electrical charge amount into the floating gate of the multi-level cell.

20. The control device of claim 19, wherein the second electrical charge amount is different from the third electrical charge amount.

21. The control device of claim 15, wherein the determining unit is further arranged to determine a data polarity of the third bit to be written into the multi-level cell; when the data polarity of the first bit is the first polarity, the data polarity of the second bit is the first polarity, and the data polarity of the third bit is the first polarity, the writing unit does not inject a fourth electrical charge amount into the floating gate of the multi-level cell; when the data polarity of the first bit is the first polarity, the data polarity of the second bit is the first polarity, and the data polarity of the third bit is the second polarity, the writing unit injects the fourth electrical charge amount into the floating gate of the multi-level cell; when the data polarity of the first bit is the first polarity, the data polarity of the second bit is the second polarity, and the data polarity of the third bit is the first polarity, the writing unit does not inject a fifth electrical charge amount into the floating gate of the multi-level cell; when the data polarity of the first bit is the first polarity, the data polarity of the second bit is the second polarity, and the data polarity of the third bit is the second polarity, the writing unit injects the fifth electrical charge amount into the floating gate of the multi-level cell; when the data polarity of the first bit is the second polarity, the data polarity of the second bit is the first polarity, and the data polarity of the third bit is the first polarity, the writing unit does not inject a sixth electrical charge amount into the floating gate of the multi-level cell; when the data polarity of the first bit is the second polarity, the data polarity of the second bit is the first polarity, and the data polarity of the third bit is the second polarity, the writing unit injects the sixth electrical charge amount into the floating gate of the multi-level cell; when the data polarity of the first bit is the second polarity, the data polarity of the second bit is the second polarity, and the data polarity of the third bit is the first polarity, the writing unit does not inject a seventh electrical charge amount into the floating gate of the multi-level cell; and when the data polarity of the first bit is the second polarity, the data polarity of the second bit is the second polarity, and the data polarity of the third bit is the second polarity, the writing unit injects the seventh electrical charge amount into the floating gate of the multi-level cell.

22. The control device of claim 21, wherein the fourth electrical charge amount, the fifth electrical charge amount, the sixth electrical charge amount and the seventh electrical charge amount are different from one another.

* * * * *